US011908906B2

(12) United States Patent
Yu et al.

(10) Patent No.: US 11,908,906 B2
(45) Date of Patent: Feb. 20, 2024

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hailong Yu, Shanghai (CN); Xuezhen Jing, Shanghai (CN); Hao Zhang, Shanghai (CN); Tiantian Zhang, Shanghai (CN); Jinhui Meng, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 253 days.

(21) Appl. No.: 17/446,017

(22) Filed: Aug. 26, 2021

(65) Prior Publication Data
US 2022/0077291 A1    Mar. 10, 2022

(30) Foreign Application Priority Data
Sep. 7, 2020    (CN) .......................... 202010929718.4

(51) Int. Cl.
*H01L 29/417*    (2006.01)
*H01L 27/088*    (2006.01)
(Continued)

(52) U.S. Cl.
CPC .. *H01L 29/41725* (2013.01); *H01L 21/76897* (2013.01); *H01L 21/823418* (2013.01);
(Continued)

(58) Field of Classification Search
CPC ......... H01L 29/41725; H01L 21/76897; H01L 21/823418; H01L 21/823475;
(Continued)

(56) References Cited

U.S. PATENT DOCUMENTS

2017/0148727 A1*    5/2017 Do ...................... H01L 23/5221

\* cited by examiner

*Primary Examiner* — Fernando L Toledo
*Assistant Examiner* — Adam S Bowen
(74) *Attorney, Agent, or Firm* — Anova Law Group, PLLC

(57) ABSTRACT

A semiconductor structure and a fabrication method of the semiconductor structure are provided. The method includes providing a substrate, forming a first dielectric layer and a plurality of gate structures, forming source-drain doped regions, and forming a source-drain plug. The first dielectric layer covers surfaces of the gate structure, the source-drain doped region and the source-drain plug. The method also includes forming a first plug in the first dielectric layer, and forming a second dielectric layer on the first dielectric layer. The first plug is in contact with a top surface of one of the source-drain plug and the gate structure. The second dielectric layer covers the first plug. Further, the method includes forming a second plug material film in the first and second dielectric layers. The second plug material film is in contact with the top surface of one of the source-drain plug and the gate structure.

19 Claims, 5 Drawing Sheets

(51) Int. Cl.
*H01L 21/768* (2006.01)
*H01L 21/8234* (2006.01)
*H01L 29/06* (2006.01)

(52) U.S. Cl.
CPC .... *H01L 21/823475* (2013.01); *H01L 27/088* (2013.01); *H01L 29/0649* (2013.01)

(58) Field of Classification Search
CPC . H01L 27/088; H01L 29/0649; H01L 23/485; H01L 23/5226; H01L 29/785; H01L 29/42356; H01L 21/76831; H01L 21/76849; H01L 21/76879; H01L 23/5283; H01L 23/5286
See application file for complete search history.

SEMICONDUCTOR STRUCTURE AND FABRICATION METHOD THEREOF

CROSS-REFERENCES TO RELATED APPLICATIONS

This application claims the priority of Chinese patent application No. 202010929718.4, filed on Sep. 7, 2020, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the rapid development of semiconductor manufacturing technology, higher and higher requirements have been put on the integration degree and performance of integrated circuit (IC). To improve integration degree and reduce cost, critical dimension of an IC element has been reduced, and circuit density inside the integrated circuit has been increased. Therefore, an area of a wafer surface for fabricating the required interconnection lines has become insufficient.

A connection plug inside a transistor structure includes a connection plug disposed on a surface of the gate structure for connecting the gate structure to an external circuit, and a connection plug disposed on a surface of the source-drain doped region for connection one of the source region and the drain region to an external circuit. To further meet the requirements of increasing the integration degree, the connection plug originally formed on the gate structure over the isolation region may be formed on the gate structure over the active region, which may further save the area. Moreover, the connection plug formed by a selective metal growth process has desired performance. For example, the resistivity of the connection plug is substantially low, which facilitates to improve the conductivity of the transistor.

However, the performance of the semiconductor structure including the connection plug formed by the conventional selective metal growth process still needs to be improved. The disclosed methods and device structures are directed to solve one or more problems set forth above and other problems.

BRIEF SUMMARY OF THE DISCLOSURE

One aspect of the present disclosure includes a fabrication method of a semiconductor structure. The method includes providing a substrate, forming a first dielectric layer and a plurality of gate structures over the substrate, forming source-drain doped regions in the substrate on both sides of a gate structure of the plurality of gate structures, and forming a source-drain plug on a top surface of a source-drain doped region of the source-drain doped regions. The first dielectric layer covers surfaces of the gate structure, the source-drain doped region and the source-drain plug. The method also includes forming a first plug in the first dielectric layer, where the first plug is in contact with one of a top surface of the source-drain plug and a top surface of the gate structure. Moreover, the method includes forming a second dielectric layer on a surface of the first dielectric layer, where the second dielectric layer covers a surface of the first plug. In addition, the method includes forming a second plug material film in the first dielectric layer and the second dielectric layer. The second plug material film is in contact with one of the top surface of the source-drain plug and the top surface of the gate structure. Further, the method includes planarizing the second plug material film until the surface of the first dielectric layer and a top surface of the first plug are exposed, to form a second plug in the first dielectric layer. The second plug is in contact with one of the top surface of the source-drain plug and the top surface of the gate structure.

Optionally, forming the first plug includes forming a first opening in the first dielectric layer, where the first opening exposes one of the top surface of the source-drain plug and the top surface of the gate structure; forming a first plug material film in the first opening and on the surface of the first dielectric layer; and planarizing the first plug material film until the surface of the first dielectric layer is exposed, to form the first plug in the first opening.

Optionally, forming the first opening includes forming a first patterned layer on the surface of the first dielectric layer, where the first patterned layer exposes a portion of the first dielectric layer; and using the first patterned layer as a mask, etching the first dielectric layer until one of the top surface of the source-drain plug and the top surface of the gate structure is exposed, to form the first opening.

Optionally, forming the first plug material film includes a selective metal growth process, a physical vapor deposition process, a chemical vapor deposition process, or an atomic layer deposition process.

Optionally, when the first opening exposes the top surface of the source-drain plug, the first plug material film is formed by the selective metal growth process. Parameters of the selective metal growth process include gases including $WF_6$ and $H_2$, and a temperature in a range of approximately 200° C.-400° C. A flow rate of $WF_6$ is in a range of approximately 20 sccm-150 sccm, and a flow rate of $H_2$ is in a range of approximately 5000 sccm-8000 sccm.

Optionally, the first plug is made of a material including one or more of tungsten, copper, cobalt, titanium nitride, titanium, tantalum, tantalum nitride, ruthenium, ruthenium nitride, and aluminum.

Optionally, the second plug material film is made of a material including one or more of tungsten, copper, cobalt, titanium nitride, titanium, tantalum, tantalum nitride, ruthenium, ruthenium nitride, and aluminum.

Optionally, the second plug material film is further formed on a surface of the second dielectric layer. Forming the second plug material film includes forming a second opening in the first dielectric layer and the second dielectric layer, where the second opening exposes one of the top surface of the source-drain plug and the top surface of the gate structure, and forming the second plug material film in the second opening and on the surface of the second dielectric layer.

Optionally, forming the second opening includes forming a second patterned layer on the surface of the second dielectric layer, where the second patterned layer exposes a portion of the second dielectric layer; and using the second patterned layer as a mask, etching the first dielectric layer and the second dielectric layer until one of the top surface of the source-drain plug and the top surface of the gate structure is exposed, to form the second opening.

Optionally, the second plug material film is formed by a selective metal growth process. Parameters of the selective metal growth process include gases including $WF_6$ and $H_2$, and a temperature in a range of approximately 200° C.-400° C. A flow rate of $WF_6$ is in a range of approximately 20 sccm-150 sccm, and a flow rate of $H_2$ is in a range of approximately 5000 sccm-8000 sccm.

Optionally, the first plug is in contact with the top surface of the gate structure, and the second plug material film is in contact with the top surface of the source-drain plug.

Optionally, the first plug is in contact with the top surface of the source-drain plug, and the second plug material film is in contact with the top surface of the gate structure.

Optionally, the first dielectric layer is made of a dielectric material including one or more of silicon oxide, silicon nitride, silicon carbide, silicon oxy-carbide, silicon oxy-nitride, aluminum oxide, aluminum nitride, silicon carbo-nitride, and silicon oxy-carbo-nitride.

Optionally, the second dielectric layer is made of a dielectric material including one or more of silicon oxide, silicon nitride, silicon carbide, silicon oxy-carbide, silicon oxy-nitride, aluminum oxide, aluminum nitride, silicon carbo-nitride, and silicon oxy-carbo-nitride.

Optionally, the source-drain plug includes an isolation layer and a conductive layer on the isolation layer. The isolation layer is made of a material including one or more of titanium silicide, tantalum silicide, and tungsten nitride. The conductive layer is made of a material including one or more of tungsten, copper, cobalt, titanium nitride, titanium, tantalum, tantalum nitride, ruthenium, ruthenium nitride, and aluminum.

Optionally, the gate structure includes a gate dielectric layer, a work function layer on the gate dielectric layer, and a gate electrode layer on the work function layer. The gate dielectric layer is made of a material including one or more of silicon oxide, and a high-K dielectric material. The work function layer is made of a material including one or more of TiN, TaN, TiAl, TiAlC, TaAlN, TiAlN, TaCN, and AlN. The gate electrode layer is made of a material including one or more of tungsten, copper, cobalt, titanium nitride, titanium, tantalum, tantalum nitride, ruthenium, ruthenium nitride, and aluminum.

Another aspect of the present disclosure includes a semiconductor structure. The semiconductor structure includes a first dielectric layer and a plurality of gate structures disposed over a substrate, source-drain doped regions disposed in the substrate on both sides of a gate structure of the plurality of gate structures, and a source-drain plug disposed on a top surface of a source-drain doped region of the source-drain doped regions. The first dielectric layer covers surfaces of the gate structure, the source-drain doped region and the source-drain plug. The semiconductor structure also includes a first plug disposed in the first dielectric layer, where the first plug is in contact with one of a top surface of the source-drain plug and a top surface of the gate structure. Further, the semiconductor structure includes a second dielectric layer disposed on the first dielectric layer, where the second dielectric layer covers a surface of the first plug.

Optionally, the semiconductor structure further includes a second plug material film disposed in the first dielectric layer and the second dielectric layer. The second plug material film is in contact with one of the top surface of the source-drain plug and the top surface of the gate structure.

Optionally, the first plug is in contact with the top surface of the gate structure, and the second plug material film is in contact with the top surface of the source-drain plug.

Optionally, the first plug is in contact with the top surface of the source-drain plug, and the second plug material film is in contact with the top surface of the gate structure.

The disclosed embodiments may have following beneficial effects. In the disclosed embodiments of the present disclosure, the first plug may be first formed, and then the second dielectric layer covering the surface of the first plug may be formed. Because the second dielectric layer covers the surface of the first plug, the first plug may be protected from being affected by subsequent processes. Therefore, when subsequently forming the second plug material film in the first dielectric layer and the second dielectric layer, material may not be deposited on the surface of the first plug, which may reduce the influence on the second plug material film, and may facilitate to improve the morphology of the formed second plug material film, thereby improving the performance of the formed semiconductor structure.

In addition, the second plug material film may be formed by a selective metal growth process. Because the selective metal growth process has a different deposition rate on a surface of a different material, the material may be directly deposited on the surface of a metal material to form the desired second plug material film. The second plug material film may have desired adhesion, and, thus, an additional film layer for increasing the adhesion of the second plug material film may not need to be formed, which may facilitate to improve the conductivity of the second plug material film, and may facilitate to improve the performance of the formed semiconductor structure.

Moreover, the first plug material film may be formed by a selective metal growth process. Because the selective metal growth process has a different deposition rate on a surface of a different material, the material may be directly deposited on the surface of a metal material to form the desired first plug material film. The first plug material film may have desired adhesion, and, thus, an additional film layer for increasing the adhesion of the first plug material film may not need to be formed, which may facilitate to improve the conductivity of the first plug material film, and may facilitate to improve the performance of the formed semiconductor structure.

In the disclosed semiconductor structure, because the second dielectric layer covers the surface of the first plug, the first plug may be protected from being affected by subsequent processes. Therefore, when subsequently forming the second plug material film in the first dielectric layer and the second dielectric layer, material may not be deposited on the surface of the first plug, which may reduce the influence on the second plug material film, and may facilitate to improve the morphology of the formed second plug material film, thereby improving the performance of the formed semiconductor structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
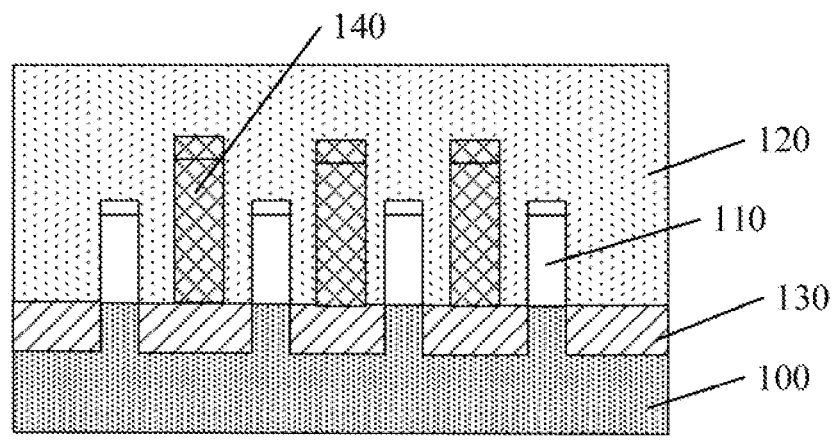
FIGS. 1-4 illustrate semiconductor structures corresponding to certain stages for forming a semiconductor structure.

FIGS. 1-4 illustrate semiconductor structures corresponding to certain stages for forming a semiconductor structure. Referring to FIG. 1, a dielectric layer 120 and a plurality of gate structures 110 are formed over a substrate 100. Source-drain doped regions 130 are formed in the substrate 100 on both sides of the gate structure 110, and a source-drain plug 140 is formed on a top surface of the source-drain doped region 130. The dielectric layer 120 covers the surfaces of the gate structure 110, the source-drain doped region 130 and the source-drain plug 140.

Figure 2:
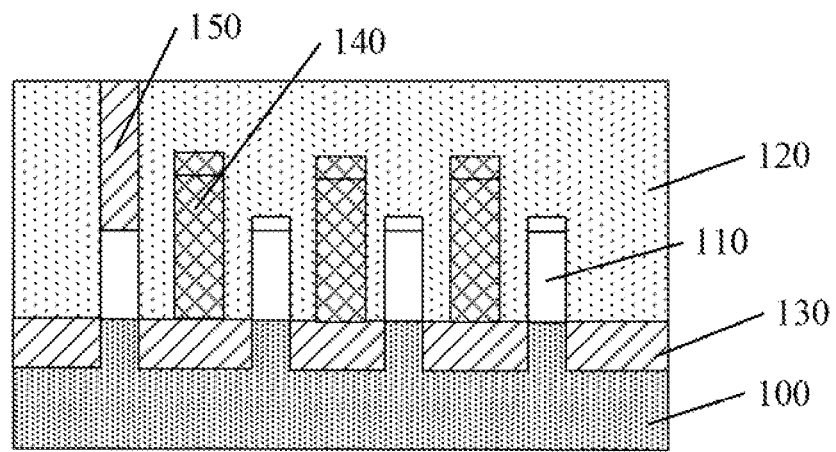

Referring to FIG. 2, a first opening (not shown in the Figure) is formed in the dielectric layer 120, and a bottom of the first opening exposes the top surface of the gate structure 110. A first plug 150 is formed in the first opening, and the first plug 150 is in contact with the top surface of the gate structure 110.

Figure 3:
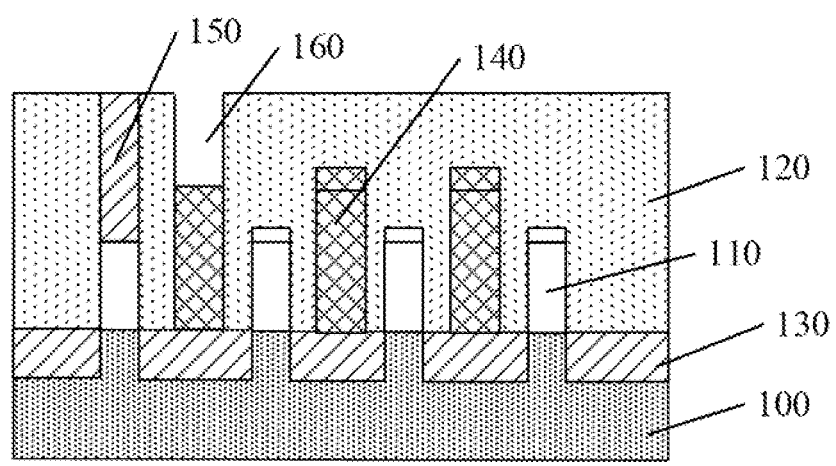

Referring to FIG. 3, a second opening 160 is formed in the dielectric layer 120, and the second opening 160 exposes the top surface of the source-drain plug 140.

Figure 4:
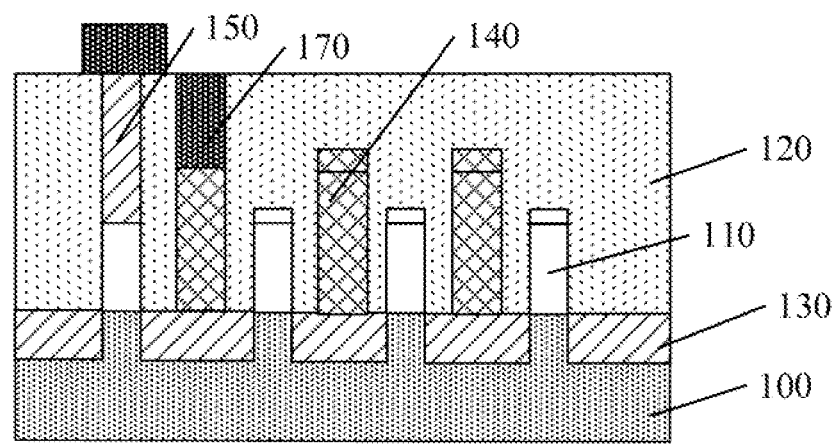

Referring to FIG. 4, a second plug 170 is formed in the second opening 160 by a selective metal growth process.

In the above method, because the selective metal growth process has a different deposition rate on a surface of a different material, the second plug 170 is directly deposited on the surface of a metal material, and the second plug 170 has desired adhesion. Therefore, an additional film layer for increasing the adhesion of the second plug 170 does not need to be formed, which facilitates to improve the performance of the formed semiconductor structure.

However, when forming the second plug 170 using a selective metal growth process, because the top surface of the first plug 150 is exposed, the material of the second plug is not only grown on the top surface of the source-drain plug 140 exposed by the second opening 160, but also grown on the surface of the first plug 150. Furthermore, because the distance between the gate structure 120 and the source-drain plug 140 is substantially small, the distance between the first plug 150 and the second opening 160 is substantially small, and the material grown on the surface of the first plug 150 may tend to be extended to the second opening 160, which easily causes the second opening 160 to be closed prematurely and causes cavities in the second opening 160. Therefore, the formed second plug 170 has poor morphology and tends to open circuit.

Figure 11:
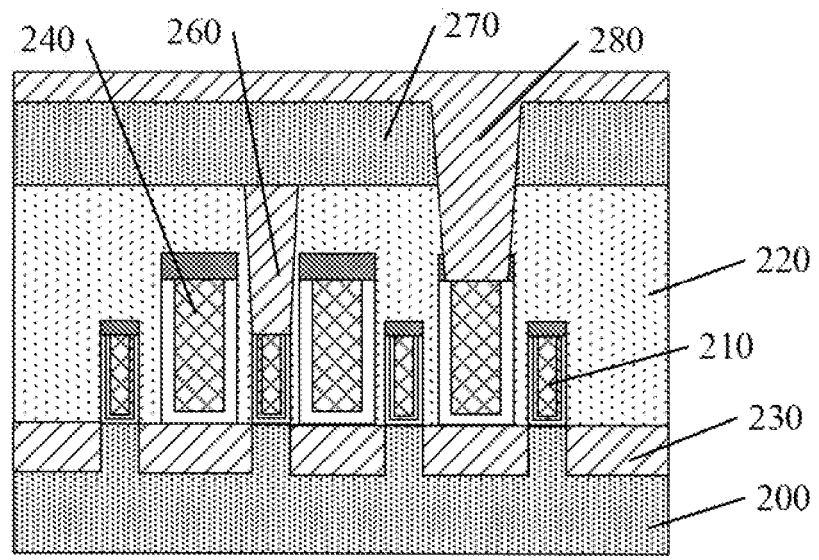
Figure 12:
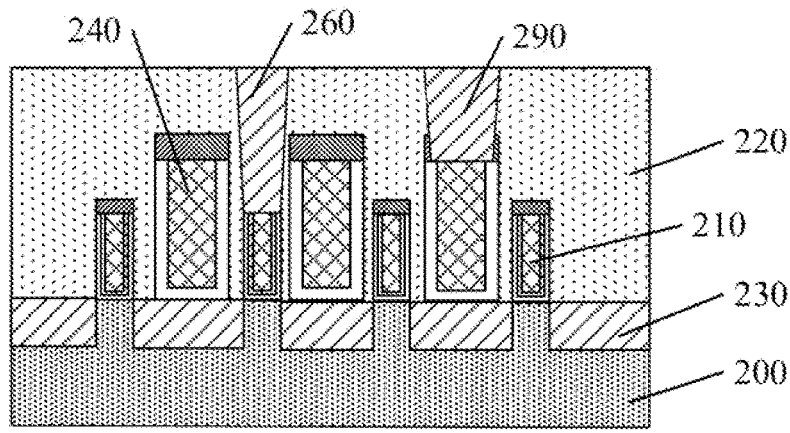
Figure 13:
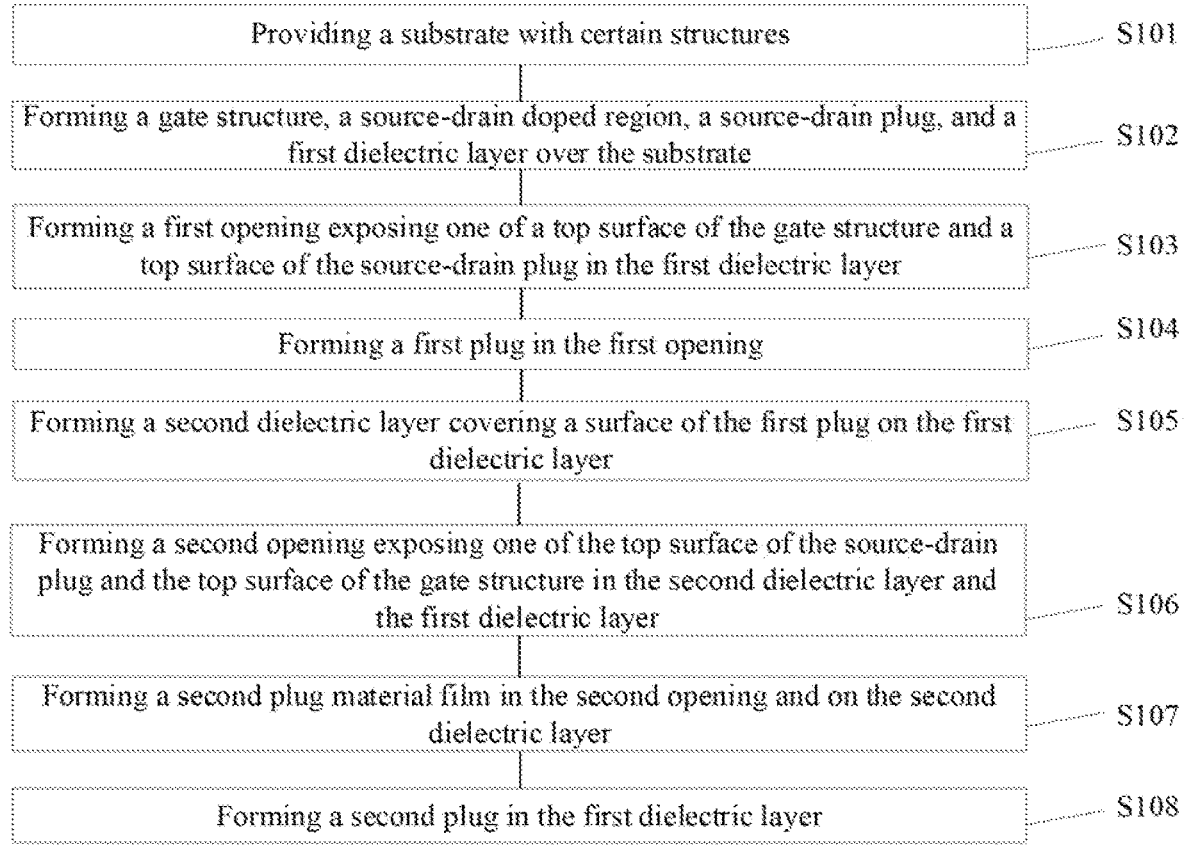
FIG. 13 illustrates a flowchart of an exemplary method for forming a semiconductor structure consistent with various disclosed embodiments of the present disclosure.

The present disclosure provides a semiconductor structure and a fabrication method thereof. The method may include: forming a first plug in a first dielectric layer, where the first plug may be in contact with a top surface of a source-drain plug or a top surface of a gate structure; forming a second dielectric on a surface of the first dielectric layer, where the second dielectric layer may cover a surface of the first plug; and forming a second plug material film in the first dielectric layer and the second dielectric layer, where the second plug material film may be in contact with the top surface of the source-drain plug or the top surface of the gate structure. Because the second dielectric layer covers the surface of the first plug, the first plug may be protected from being affected by subsequent processes, such that in the process of subsequently forming the second plug material film in the first dielectric layer and the second dielectric layer, material may not be deposited on the surface of the first plug, thereby reducing the influence on the second plug material film. FIG. 13 illustrates a flowchart of a method for forming a semiconductor structure consistent with various disclosed embodiments of the present disclosure, and FIGS. 5-12 illustrate semiconductor structures corresponding to certain stages of the fabrication method.

Figure 5:
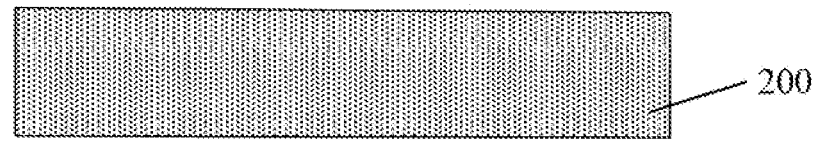
FIGS. 5-12 illustrate semiconductor structures corresponding to certain stages for forming an exemplary semiconductor structure consistent with various disclosed embodiments of the present disclosure.

As shown in FIG. 13, at the beginning of the fabrication method, a substrate with certain structures may be provided (S101). FIG. 5 illustrates a corresponding semiconductor structure.

Referring to FIG. 5, a substrate 200 may be provided. The substrate 200 may include a base (not illustrated) and one or more fins (not illustrated) on the base.

In one embodiment, the base and the fin may be made of monocrystalline silicon, polysilicon, amorphous silicon, or silicon germanium. In another embodiment, the base and the fin may be made of silicon on insulator (SOI), or any other semiconductor material (e.g., group III-V compounds such as gallium arsenide, etc.).

In one embodiment, forming the substrate 200 may include providing an initial substrate, and patterning the initial substrate to form the base and the one or more fins on the base. In another embodiment, the substrate may be a planar base.

Figure 6:
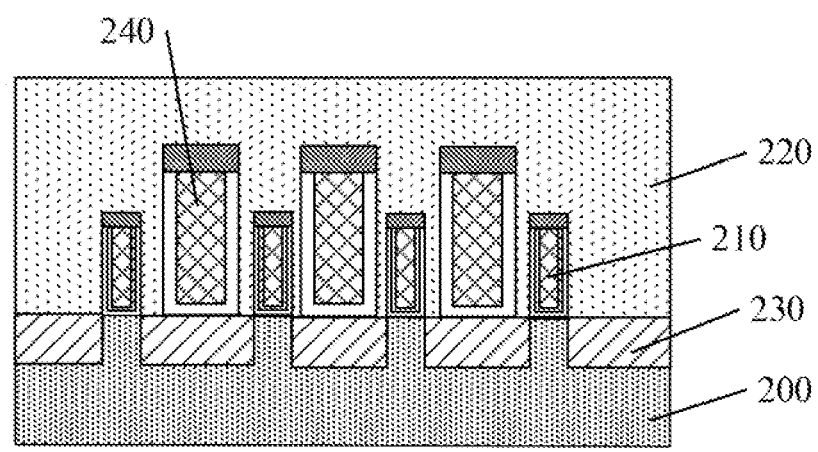

Returning to FIG. 13, after providing the substrate, a gate structure, a source-drain doped region, a source-drain plug, and a first dielectric layer may be formed over the substrate (S102). FIG. 6 illustrates a corresponding semiconductor structure.

Referring to FIG. 6, a first dielectric layer 220 and a plurality of gate structures 210 may be formed over the substrate 200. Source-drain doped regions 230 may be formed in the substrate 200 on both sides of the gate structure 210, and a source-drain plug 240 may be formed on a top surface of the source-drain doped region 230. The first dielectric layer 220 may cover the surfaces of the gate structure 210, the source-drain doped region 230 and the source-drain plug 240.

Forming the plurality of gate structures 210, the first dielectric layer 220, and the source-drain doped regions 230 may include: forming a plurality of dummy gate structures (not shown in the Figure) over the substrate 200; forming the source-drain doped regions 230 in the substrate 200 on both sides of each dummy gate structure; forming a first dielectric portion (not shown in the Figure) over the substrate 200, where the first dielectric portion may cover the sidewall surface of the dummy gate structure; removing the dummy gate structure to from a gate opening in the first dielectric portion; forming a gate structure 210 in the gate opening; and forming a second dielectric portion on the surface of the first dielectric portion, where a top surface of the second dielectric portion may be above the top surface of the gate structure 210, and the first dielectric portion and the second dielectric portion may form the first dielectric layer 220.

The first dielectric layer 220 may be made of a dielectric material, and the dielectric material may include one or more of silicon oxide, silicon nitride, silicon carbide, silicon oxy-carbide, silicon oxy-nitride, aluminum oxide, aluminum nitride, silicon carbo-nitride, and silicon oxy-carbo-nitride.

Forming the source-drain plug 240 may include: forming a third patterned layer (not shown in the Figure) on the surface of the first dielectric layer 220, where the third patterned layer may expose the surface of the first dielectric layer 220 over the source-drain doped region 230; and using the third patterned layer as a mask, etching the first dielectric layer 220 until the top surface of the source-drain doped region 230 is exposed, to form a source-drain opening (not shown in the Figure) in the dielectric layer 220; and forming the source-drain plug 240 in the source-drain opening.

The source-drain plug 240 may include an isolation layer (not labelled in the Figure) and a conductive layer (not labelled in the Figure) on the isolation layer. In one embodiment, the isolation layer may be disposed on the bottom and the sidewall surface of the source-drain opening. The isolation layer may be made of a material including titanium silicide, tantalum silicide, or tungsten nitride.

On the one hand, the isolation layer may increase the adhesion of the conductive layer, thereby improving the performance of the source-drain plug 240. On the other hand, the isolation layer may block the atoms or ions in the conductive layer from diffusing into the first dielectric layer 220 and may avoid electrical leakage, thereby improving the performance of the semiconductor structure.

The conductive layer may be made of a material including one or more of tungsten, copper, cobalt, titanium nitride, titanium, tantalum, tantalum nitride, ruthenium, ruthenium nitride, and aluminum.

The gate structure 210 may include a gate dielectric layer (not labelled in the Figure), a work function layer (not labelled in the Figure) on the surface of the gate dielectric layer, and a gate electrode layer (not labelled in the Figure) on the surface of the work function layer.

The gate dielectric layer may be made of a material including silicon oxide, or a high-K dielectric material. The work function layer may be made of a material including one or more of TiN, TaN, TiAl, TiAlC, TaAlN, TiAlN, TaCN, and AlN. The gate electrode layer may be made of a material including one or more of tungsten, copper, cobalt, titanium nitride, titanium, tantalum, tantalum nitride, ruthenium, ruthenium nitride, and aluminum.

The high-K dielectric material may refer to a material with a dielectric constant greater than 3.9. In one embodiment, the gate dielectric layer may be disposed on the bottom and sidewall surface of the gate opening.

Because the gate structure 210 includes the gate dielectric layer, the work function layer, and the gate electrode layer, and the source-drain plug 240 includes the isolation layer and the conductive layer, the material composition of the gate structure 210 may be substantially complex, and the material composition of the source-drain plug 240 may be substantially simple. If a selective metal growth process is used, the film layers formed over the top surface of the gate structure 210 and over the top surface of the source-drain plug 240 may be significantly different.

In one embodiment, a first protection layer (not shown in the Figure) may be formed on the top surface of the source-drain plug 240, which may prevent over-etching when subsequently forming the electrical connection structure on the top of the source-drain plug 240, and may avoid short circuits between the source-drain plug 240 and the gate structure 210 and between the source-drain plug 240 and the electrical connection structure.

In one embodiment, a second protection layer (not shown in the Figure) may be formed on the top surface of the gate structure 210, which may avoid over-etching when subsequently forming the electrical connection structure on the top of the gate structure 210, and may avoid short circuits between the gate structure 210 and the source-drain plug 240 and between the gate structure 210 and the electrical connection structure.

Then, a first plug may be formed in the first dielectric layer 220, and the first plug may be in contact with the top surface of the source-drain plug 240 or the top surface of the gate structure 210. Specification process of forming the first plug may refer to FIG. 7 and FIG. 8.

Figure 7:
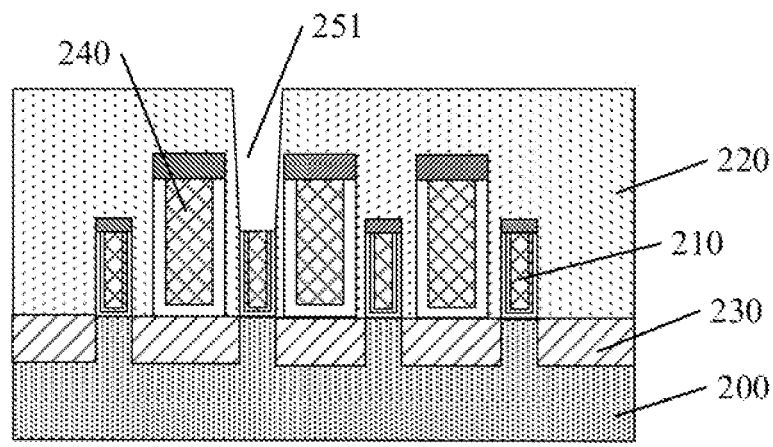

Returning to FIG. 13, after forming the first dielectric layer, a first opening exposing a top surface of the gate structure or a top surface of the source-drain plug may be formed in the first dielectric layer (S103). FIG. 7 illustrates a corresponding semiconductor structure.

Referring to FIG. 7, a first opening 251 may be formed in the first dielectric layer 220, and the first opening 251 may expose the top surface of the source-drain plug 240 or the top surface of the gate structure 210. The first opening 251 may provide space for subsequently forming the first plug.

Forming the first opening 251 may include: forming a first patterned layer 221 on the surface of the first dielectric layer 220, where the first patterned layer 221 may expose a portion of the surface of the first dielectric layer 220; and by using the first patterned layer 221 as a mask, etching the first dielectric layer 220 until the top surface of the source-drain plug 240 or the top surface of the gate structure 210 is exposed, to form the first opening 251.

Etching the first dielectric layer 220 may include one or more of a dry etching process and a wet etching process. In one embodiment, a dry etching process may be used to etch the first dielectric layer 220, which may facilitate to improve the morphology of the formed first opening 251, thereby improving the performance of the formed semiconductor structure.

In one embodiment, the first opening 251 may expose the top surface of the gate structure 210. In another embodiment, the first opening may expose the top surface of the source-drain plug.

Figure 8:
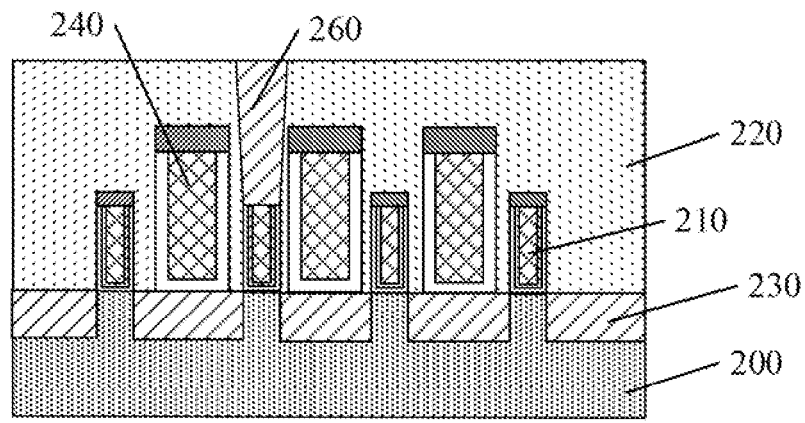

Returning to FIG. 13, after forming the first opening, a first plug may be formed in the first opening (S104). FIG. 8 illustrates a corresponding semiconductor structure.

Referring to FIG. 8, a first plug material film (not shown in the Figure) may be formed in the first opening 251 and on the surface of the first dielectric layer 220. The first plug material film may be planarized until the surface of the first dielectric layer 220 is exposed, to form the first plug 260 in the first opening 251.

In one embodiment, because the first opening 251 exposes the top surface of the gate structure 210, the first plug 260 formed in the first opening 251 may be disposed on the top surface of the gate structure 210.

Forming the first plug material film may include a selective metal growth process, a physical vapor deposition process, a chemical vapor deposition process, or an atomic layer deposition process. In one embodiment, forming the first plug material film may include a chemical vapor deposition process.

In certain embodiments, when the first opening exposes the top surface of the source-drain plug, forming the first plug material film may include a selective metal growth process. Parameters of the selective metal growth process may include: gases including $WF_6$ and $H_2$, where a flow rate of $WF_6$ is in a range of approximately 20 sccm-150 sccm, and a flow rate of $H_2$ is in a range of approximately 5000 sccm-8000 sccm, and a temperature in a range of approximately 200° C.-400° C.

Because the selective metal growth process has a different deposition rate on a surface of a different material and the material composition of the source-drain plug is simple, the first plug material may be directly deposited on the surface of the source-drain plug to form the desired first plug material film. The first plug material film may have desired adhesion, and, thus, an additional film layer for increasing the adhesion of the first plug material film may not need to be formed, which may facilitate to improve the performance of the formed semiconductor structure.

In certain embodiments, when the first opening exposes the top surface of the source-drain plug, forming the first plug material film may include a physical vapor deposition process, a chemical vapor deposition process, or an atomic layer deposition process.

The first plug material film may be made of a material including one or more of tungsten, copper, cobalt, titanium nitride, titanium, tantalum, tantalum nitride, ruthenium, ruthenium nitride, and aluminum. In one embodiment, the first plug material film may be made of tungsten, and the first plug 260 formed from the first plug material film may be made of tungsten.

Figure 9:
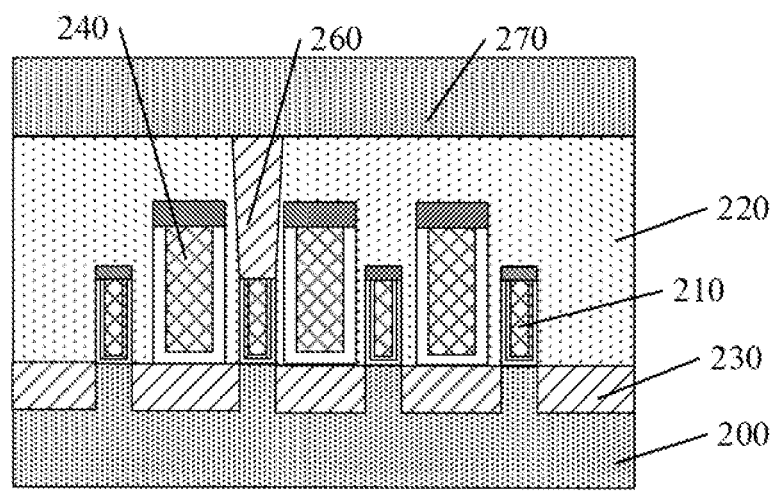

Returning to FIG. 13, after forming the first plug, a second dielectric layer may be formed (S105). FIG. 9 illustrates a corresponding semiconductor structure.

Referring to FIG. 9, a second dielectric layer 270 may be formed on the first dielectric layer 220, and the second dielectric layer 270 may cover the surface of the first plug 260. In one embodiment, the second dielectric layer 270 may cover the top surface of the first plug 260.

The second dielectric layer 270 may be made of a dielectric material, and the dielectric material may include one or more of silicon oxide, silicon nitride, silicon carbide, silicon oxy-carbide, silicon oxy-nitride, aluminum oxide, aluminum nitride, silicon carbo-nitride, and silicon oxy-carbo-nitride. In one embodiment, the second dielectric layer 270 may be made of silicon oxide.

The first plug 260 may be first formed, and then the second dielectric layer 270 covering the surface of the first plug 260 may be formed. Because the second dielectric layer 270 covers the surface of the first plug 260, the first plug 260 may be protected from being affected by subsequent processes. Therefore, when subsequently forming a second plug material film in the first dielectric layer 220 and the second dielectric layer 270, material may not be deposited on the surface of the first plug 260, which may reduce the influence on the second plug material film, and may facilitate to improve the morphology of the formed second plug material film, thereby improving the performance of the formed semiconductor structure.

Then, a second plug material film may be formed in the first dielectric layer 220 and the second dielectric layer 270, and the second plug material film may be in contact with the top surface of the source-drain plug 240 or the top surface of the gate structure 210. The formation process of the second plug material film may refer to FIG. 10 and FIG. 11.

Figure 10:
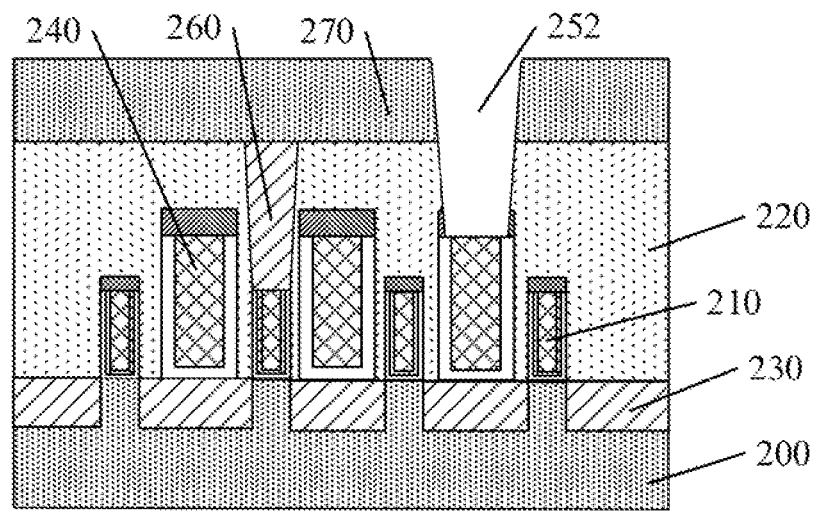

Returning to FIG. 13, after forming the second dielectric layer, a second opening exposing the top surface of the source-drain plug or the top surface of the gate structure may be formed in the second dielectric layer and the first dielectric layer (S106). FIG. 10 illustrates a corresponding semiconductor structure.

Referring to FIG. 10, a second opening 252 may be formed in the first dielectric layer 260 and the second dielectric layer 270, and the second opening 252 may expose the top surface of the source-drain plug 240 or the top surface of the gate structure 210. The second opening 252 may provide space for subsequently forming the second plug.

Forming the second opening 252 may include: forming a second patterned layer (not illustrated) on the second dielectric layer 270, where the second patterned layer may expose a portion of the surface of the second dielectric layer 270; and by using the second patterned layer as a mask, etching the first dielectric layer 220 and the second dielectric layer 270 until the top surface of the source-drain plug 240 or the top surface of the gate structure 210 is exposed, to form the second opening 252.

Etching the first dielectric layer 220 and the second dielectric layer 270 may include one or more of a dry etching process and a wet etching process. In one embodiment, a dry etching process may be used to etch the first dielectric layer 220 and the second dielectric layer 270, which may facilitate to improve the morphology of the formed second opening 252, thereby improving the performance of the formed semiconductor structure.

In one embodiment, the second opening 252 may expose the top surface of the source-drain plug 240. In another embodiment, the second opening may expose the top surface of the gate structure.

Returning to FIG. 13, after forming the second opening, a second plug material film may be formed in the second opening and on the second dielectric layer (S107). FIG. 11 illustrates a corresponding semiconductor structure.

Referring to FIG. 11, a second plug material film 280 may be formed in the second opening 252 and on the second dielectric layer 270.

Forming the second plug material film 280 may include a selective metal growth process. Parameters of the selective metal growth process may include: gases including $WF_6$ and $H_2$, where a flow rate of $WF_6$ is in a range of approximately 20 sccm-150 sccm, and a flow rate of $H_2$ is in a range of approximately 5000 sccm-8000 sccm, and a temperature in a range of approximately 200° C.-400° C.

The second plug material film 280 may be formed by a selective metal growth process. Because the selective metal growth process has a different deposition rate on a surface of a different material, the material may be directly deposited on the surface of a metal material to form the desired second plug material film 280. The second plug material film 280 may have desired adhesion, and, thus, an additional film layer for increasing the adhesion of the second plug material film 280 may not need to be formed, which may facilitate to improve the conductivity of the second plug material film 280, and may facilitate to improve the performance of the formed semiconductor structure.

In one embodiment, the second opening 252 may expose the top surface of the source-drain plug 240. Because the material composition of the source-drain plug 240 is simple, the selective metal growth process may facilitate to improve the adhesion of the second plug material film formed on the top surface of the source-drain plug 240, may facilitate to improve the conductivity of the second plug material film 280, thereby improving the performance of the formed semiconductor structure.

The second plug material film 280 may be made of a material including one or more of tungsten, copper, cobalt, titanium nitride, titanium, tantalum, tantalum nitride, ruthenium, ruthenium nitride, and aluminum. In one embodiment, the second plug material film 280 may be made of tungsten.

In one embodiment, the first plug 260 may be in contact with the top surface of the gate structure 210, and the second plug material film 280 may be in contact with the top surface of the source-drain plug 240.

In another embodiment, the first plug may be in contact with the top surface of the source-drain plug, and the second plug material film may be in contact with the top surface of the gate structure.

Returning to FIG. 13, after forming the second plug material film, a second plug may be formed (S108). FIG. 12 illustrates a corresponding semiconductor structure.

Referring to FIG. 12, the second plug material film 280 may be planarized until the surface of the first dielectric layer 220 and the top surface of the first plug 260 are exposed, to form the second plug 290 in the first dielectric layer 220. The second plug 290 may be in contact with the top surface of the source-drain plug 240 or the top surface of the gate structure 210. Planarizing the second plug material film 280 may include a chemical mechanical polishing process.

In one embodiment, the first plug 260 may be in contact with the top surface of the gate structure 210, and the second plug 290 may be in contact with the top surface of the source-drain plug 240.

In another embodiment, the first plug may be in contact with the top surface of the source-drain plug, and the second plug may be in contact with the top surface of the gate structure.

Correspondingly, the present disclosure also provides a semiconductor structure. Referring to FIG. 11, the semiconductor structure may include a substrate 200, and a first dielectric layer 220 and a plurality of gate structures 210 disposed over the substrate 200. The semiconductor structure may also include source-drain doped regions 230 in the substrate 200 on both sides of the gate structure 210, and a source-drain plug 240 disposed on the top surface of the source-drain doped region 230. The first dielectric layer 220 may cover the surfaces of the gate structure 210, the source-drain doped region 230 and the source-drain plug 240. Moreover, the semiconductor structure may include a first plug 260 in the first dielectric layer 230. The first plug 260 may be in contact with a top surface of the source-drain plug 240 or a top surface of the gate structure 210. Further, the semiconductor structure may include a second dielectric layer 270 disposed on the first dielectric layer 220, and the second dielectric layer 270 may cover the surface of the first plug 260.

In one embodiment, the first plug 260 may be in contact with the top surface of the source-drain plug 240. In another embodiment, the first plug may be in contact with the top surface of the gate structure.

The semiconductor structure may further include a second plug material film 280 in the first dielectric layer 220 and the second dielectric layer 270. The second plug material film 280 may be in contact with the top surface of the source-drain plug 240 or the top surface of the gate structure 210.

In one embodiment, the second plug material film 280 may be in contact with the top surface of the gate structure 210. In another embodiment, the second plug material film may be in contact with the top surface of the source-drain plug.

In one embodiment, the second plug material film 280 may further be disposed over the second dielectric layer 270. In certain embodiments, the second plug material film may merely be formed in the first dielectric layer and the second dielectric layer.

Because the second dielectric layer 270 covers the surface of the first plug 260, the first plug 260 may be protected from being affected by subsequent processes. Therefore, when subsequently forming the second plug material film 280 in the first dielectric layer 220 and the second dielectric layer 270, material may not be deposited on the surface of the first plug 260, which may reduce the influence on the second plug material film 280, and may facilitate to improve the morphology of the formed second plug material film 280, thereby improving the performance of the formed semiconductor structure.

The disclosed embodiments may have following beneficial effects. In the disclosed embodiments of the present disclosure, the first plug may be first formed, and then the second dielectric layer covering the surface of the first plug may be formed. Because the second dielectric layer covers the surface of the first plug, the first plug may be protected from being affected by subsequent processes. Therefore, when subsequently forming the second plug material film in the first dielectric layer and the second dielectric layer, material may not be deposited on the surface of the first plug, which may reduce the influence on the second plug material film, and may facilitate to improve the morphology of the formed second plug material film, thereby improving the performance of the formed semiconductor structure.

In addition, the second plug material film may be formed by a selective metal growth process. Because the selective metal growth process has a different deposition rate on a surface of a different material, the material may be directly deposited on the surface of a metal material to form the desired second plug material film. The second plug material film may have desired adhesion, and, thus, an additional film layer for increasing the adhesion of the second plug material film may not need to be formed, which may facilitate to improve the conductivity of the second plug material film, and may facilitate to improve the performance of the formed semiconductor structure.

Moreover, the first plug material film may be formed by a selective metal growth process. Because the selective metal growth process has a different deposition rate on a surface of a different material, the material may be directly deposited on the surface of a metal material to form the desired first plug material film. The first plug material film may have desired adhesion, and, thus, an additional film layer for increasing the adhesion of the first plug material film may not need to be formed, which may facilitate to improve the conductivity of the first plug material film, and may facilitate to improve the performance of the formed semiconductor structure.

In the disclosed semiconductor structure, because the second dielectric layer covers the surface of the first plug, the first plug may be protected from being affected by subsequent processes. Therefore, when subsequently forming the second plug material film in the first dielectric layer and the second dielectric layer, material may not be deposited on the surface of the first plug, which may reduce the influence on the second plug material film, and may facilitate to improve the morphology of the formed second plug material film, thereby improving the performance of the formed semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A fabrication method of a semiconductor structure, comprising:
   providing a substrate;
   forming a first dielectric layer and a plurality of gate structures over the substrate, forming source-drain doped regions in the substrate on both sides of a gate structure of the plurality of gate structures, and forming a source-drain plug on a top surface of a source-drain doped region of the source-drain doped regions, wherein the first dielectric layer covers surfaces of the gate structure, the source-drain doped region and the source-drain plug;

forming a first plug in the first dielectric layer, wherein the first plug is in contact with one of a top surface of the source-drain plug and a top surface of the gate structure;

forming a second dielectric layer on a surface of the first dielectric layer, wherein the second dielectric layer covers a surface of the first plug;

forming a second plug material film in the first dielectric layer and the second dielectric layer, wherein the second plug material film is in contact with one of the top surface of the source-drain plug and the top surface of the gate structure; and planarizing the second plug material film until the surface of the first dielectric layer and a top surface of the first plug are exposed, to form a second plug in the first dielectric layer, wherein the second plug is in contact with one of the top surface of the source-drain plug and the top surface of the gate structure.

2. The method according to claim 1, wherein forming the first plug includes:

forming a first opening in the first dielectric layer, wherein the first opening exposes one of the top surface of the source-drain plug and the top surface of the gate structure;

forming a first plug material film in the first opening and on the surface of the first dielectric layer; and planarizing the first plug material film until the surface of the first dielectric layer is exposed, to form the first plug in the first opening.

3. The method according to claim 2, wherein forming the first opening includes:

forming a first patterned layer on the surface of the first dielectric layer, wherein the first patterned layer exposes a portion of the first dielectric layer; and using the first patterned layer as a mask, etching the first dielectric layer until one of the top surface of the source-drain plug and the top surface of the gate structure is exposed, to form the first opening.

4. The method according to claim 2, wherein forming the first plug material film includes:

a selective metal growth process, a physical vapor deposition process, a chemical vapor deposition process, or an atomic layer deposition process.

5. The method according to claim 4, wherein:

when the first opening exposes the top surface of the source-drain plug, the first plug material film is formed by the selective metal growth process; and parameters of the selective metal growth process include:
gases including $WF_6$ and $H_2$, wherein a flow rate of $WF_6$ is in a range of approximately 20 sccm-150 sccm, and a flow rate of $H_2$ is in a range of approximately 5000 sccm-8000 sccm, and
a temperature in a range of approximately 200° C.-400° C.

6. The method according to claim 1, wherein:

the first plug is made of a material including one or more of tungsten, copper, cobalt, titanium nitride, titanium, tantalum, tantalum nitride, ruthenium, ruthenium nitride, and aluminum.

7. The method according to claim 1, wherein:

the second plug material film is made of a material including one or more of tungsten, copper, cobalt, titanium nitride, titanium, tantalum, tantalum nitride, ruthenium, ruthenium nitride, and aluminum.

8. The method according to claim 1, wherein:

the second plug material film is further formed on a surface of the second dielectric layer; and forming the second plug material film includes:

forming a second opening in the first dielectric layer and the second dielectric layer, wherein the second opening exposes one of the top surface of the source-drain plug and the top surface of the gate structure, and forming the second plug material film in the second opening and on the surface of the second dielectric layer.

9. The method according to claim 8, wherein forming the second opening includes:

forming a second patterned layer on the surface of the second dielectric layer, wherein the second patterned layer exposes a portion of the second dielectric layer; and using the second patterned layer as a mask, etching the first dielectric layer and the second dielectric layer until one of the top surface of the source-drain plug and the top surface of the gate structure is exposed, to form the second opening.

10. The method according to claim 1, wherein:

the second plug material film is formed by a selective metal growth process; and parameters of the selective metal growth process include:
gases including $WF_6$ and $H_2$, wherein a flow rate of $WF_6$ is in a range of approximately 20 sccm-150 sccm, and a flow rate of $H_2$ is in a range of approximately 5000 sccm-8000 sccm, and
a temperature in a range of approximately 200° C.-400° C.

11. The method according to claim 1, wherein:

the first plug is in contact with the top surface of the gate structure, and the second plug material film is in contact with the top surface of the source-drain plug.

12. The method according to claim 1, wherein:

the first plug is in contact with the top surface of the source-drain plug, and the second plug material film is in contact with the top surface of the gate structure.

13. The method according to claim 1, wherein:

the first dielectric layer is made of a dielectric material including one or more of silicon oxide, silicon nitride, silicon carbide, silicon oxy-carbide, silicon oxy-nitride, aluminum oxide, aluminum nitride, silicon carbo-nitride, and silicon oxy-carbo-nitride.

14. The method according to claim 1, wherein:

the second dielectric layer is made of a dielectric material including one or more of silicon oxide, silicon nitride, silicon carbide, silicon oxy-carbide, silicon oxy-nitride, aluminum oxide, aluminum nitride, silicon carbo-nitride, and silicon oxy-carbo-nitride.

15. The method according to claim 1, wherein:

the source-drain plug includes an isolation layer and a conductive layer on the isolation layer, wherein:

the isolation layer is made of a material including one or more of titanium silicide, tantalum silicide, and tungsten nitride, and the conductive layer is made of a material including one or more of tungsten, copper, cobalt, titanium nitride, titanium, tantalum, tantalum nitride, ruthenium, ruthenium nitride, and aluminum.

16. The method according to claim 1, wherein:

the gate structure includes a gate dielectric layer, a work function layer on the gate dielectric layer, and a gate electrode layer on the work function layer, wherein:

the gate dielectric layer is made of a material including one or more of silicon oxide, and a high-K dielectric material, the work function layer is made of a material including one or more of TiN, TaN, TiAl, TiAlC, TaAlN, TiAlN, TaCN, and AlN, and the gate electrode layer is made of a material including one or more of tungsten, copper, cobalt, titanium nitride, titanium, tantalum, tantalum nitride, ruthenium, ruthenium nitride, and aluminum.

17. A semiconductor structure, comprising:

a first dielectric layer and a plurality of gate structures disposed over a substrate, source-drain doped regions disposed in the substrate on both sides of a gate structure of the plurality of gate structures, and a source-drain plug disposed on a top surface of a source-drain doped region of the source-drain doped regions, wherein the first dielectric layer covers surfaces of the gate structure, the source-drain doped region and the source-drain plug;

a first plug disposed in the first dielectric layer, wherein the first plug is in contact with one of a top surface of the source-drain plug and a top surface of the gate structure;

a second dielectric layer disposed on the first dielectric layer, wherein the second dielectric layer covers a surface of the first plug; and a second plug material film disposed in the first dielectric layer and the second dielectric layer, wherein the second plug material film is in contact with one of the top surface of the source-drain plug and the top surface of the gate structure.

18. The semiconductor structure according to claim 17, wherein:

the first plug is in contact with the top surface of the gate structure, and the second plug material film is in contact with the top surface of the source-drain plug.

19. The semiconductor structure according to claim 17, wherein:

the first plug is in contact with the top surface of the source-drain plug, and the second plug material film is in contact with the top surface of the gate structure.

* * * * *